United States Patent [19]

Hertler et al.

[11] Patent Number: 5,206,317
[45] Date of Patent: Apr. 27, 1993

[54] RESIST MATERIAL AND PROCESS FOR USE

[75] Inventors: Walter R. Hertler, Kennett Square, Pa.; Dotsevi Y. Sogah, Wilmington, Del.; Gary N. Taylor, Bridgewater, N.J.

[73] Assignees: E. I. du Pont de Nemours and Company, Wilmington, Del.; American Telephone and Telegraph Company, New York, N.Y.

[21] Appl. No.: 507,342

[22] Filed: Apr. 10, 1990

[51] Int. Cl.$^5$ ............................................. C08F 24/00
[52] U.S. Cl. .................................... 526/220; 526/270; 526/309; 526/320
[58] Field of Search ............... 526/320, 226, 270, 309, 526/220

[56] References Cited

U.S. PATENT DOCUMENTS

| | | |
|---|---|---|
| 3,779,778 | 12/1973 | Smith et al. |
| 4,491,628 | 1/1985 | Ito et al. .............................. 430/176 |
| 4,985,332 | 1/1991 | Anderson et al. ................... 526/320 |
| 5,071,731 | 12/1991 | Chen et al. ........................... 430/271 |
| 5,072,029 | 12/1991 | Hertler ................................. 560/225 |
| 5,077,174 | 12/1991 | Bauer et al. ......................... 430/270 |

FOREIGN PATENT DOCUMENTS

| | | |
|---|---|---|
| 672947 | 10/1963 | Canada . |
| 0264908 | 4/1982 | European Pat. Off. . |
| 83118641 | 7/1983 | Japan . |

OTHER PUBLICATIONS

C. G. Willson, et al., "Resist Mat'ls. for Microelectronics", ChemTech, pp. 102–111 (1989), Willson, et al., pp. 182–189.
J. V. Crivello, Polymeric Mat'ls. Science and Engineering Preprints, vol. 61, Amer. Chem. Soc. Meeting, Sep. 1989, pp. 62–66.
J. E. Kearns, et al., J. Macromol. Sci-Chem., A8(4), 673 (1974).

*Primary Examiner*—Joseph L. Schofer
*Assistant Examiner*—Jeffrey T. Smith
*Attorney, Agent, or Firm*—Barbara C. Siegell

[57] ABSTRACT

Excellent resolution and sensitivity in the patterning of resists utilized in device and mask manufacture is obtained with a specific composition. In particular this composition involves polymers having recurring pendant acid labile α-alkoxyalkyl carboxylic acid ester moieties in the presence of an acid generator activated by actinic radiation such as UV-visible, deep ultraviolet, e-beam and x-ray radiation.

22 Claims, No Drawings

RESIST MATERIAL AND PROCESS FOR USE

BACKGROUND OF THE INVENTION

1. Field of the Invention

This invention relates to device fabrication utilizing resist compositions and, in particular fabrication of devices and masks involving resist materials undergoing acid catalyzed reaction.

2. Art Background

Lithographic patterning of circuit components has become useful in the field of device fabrication, e.g., semiconductor device fabrication, interconnection media such as printed circuit boards, and optoelectronic device fabrication. (See, for example, C. Grant Willson and Murrae J. Bowden, "Resist Materials For Microelectronics," *ChemTech*, pages 102–111 (Feb. 1989).) Such processes involve the fabrication of devices or patterned regions on a substrate such as a semiconductor substrate, e.g., silicon or on a chromium coated mask substrate. (Substrate in the context of this invention refers to the wafer, board, or mask on which the device or pattern is being formed and includes in the former case, if present, regions of semiconductor material, dielectric material, and electrically conducting material or in the latter case, optically transmitting material.) The fabrication procedure generally requires at least one step in which a resist material is formed on the substrate and a pattern is delineated in this material by exposure to correspondingly patterned, actinic radiation, e.g., deep ultraviolet radiation (150 to 300 nanometers), x-radiation (0.4 to 10 nanometers), ultraviolet radiation (300 to 400 nanometers), visible radiation (400 to 700 nanometers) and particle beams such as ion and electron beams. The actinic radiation produces a chemical reaction in the film which in turn introduces a difference in solubility between the exposed and unexposed regions. The exposed pattern in the resist is developed with a suitable solvent that preferentially solubilizes the exposed or unexposed region. The pattern thus produced in the resist material is employed as a protective barrier in subsequent device fabrication steps such as etching, ion implantation, deposition and dopant diffusion or employed as a protective barrier for etching mask substrates.

Various resist materials relying on a wide variety of chemistries have been proposed for use in device fabrication. One such approach is discussed in U.S. Pat. No. 3,779,778. This approach employs a water insoluble polymer containing one or more acid degradable groups and a photosensitive acid generator. Examples of photoacid generating compounds are described in a paper by J. V. Crivello, "The Chemistry of Photoacid Generating Compounds" in Polymeric Materials Science and Engineering Preprints, Vol. 61, Amer. Chem. Soc. Meeting, Miami, Fla., Sept. 11–15, 1989, pp. 62–66 and references therein. The crux of this approach involves the use of a radiolytic acid generator and a polymer whose pendant groups are chosen to be catalytically acid labile; thus, the polymer is disclosed to contain one or more acid degradable linkages which are formed by the nucleophilic reaction of hydroxy aromatic compounds, N-alkylaryl sulfonamides or certain secondary amines with alkyl vinyl ethers such as methyl vinyl ether, ethyl vinyl ether or dihydropyran. (As to this last embodiment, the reactions of dihydropyran materials as protecting groups removed by relatively mild conditions are described by J. E. Kerns et al., *Journal of Macromolecular Science and Chemistry*, A8(4), 673 (1974).) (See also Canadian Patent No. 672,947).

U.S. Pat. No. 4,491,628 also discloses resist materials sensitive to ultraviolet, deep ultraviolet, electron beam and x-ray radiation employing an acid generator with a polymer having acid labile pendant groups. The polymers include recurrent pendant groups such as tertiary butyl ester or tertiary butyl carbonate groups together with a generator of acid that catalytically converts the protecting moiety to an aqueous base solubilizing group. (A sensitizer that alters wavelength sensitivity also is discussed.) The preferred acid labile pendant groups are tertiary butyl esters of carboxylic acids and tertiary butyl ethers and carbonates of phenols. However, other acid labile groups such as trityl, benzyl, benzylhydryl as well as others characterized as "well known in the art" are discussed In a third resist employing an acid generator and polymer combination (European Patent Application 0264908) the auto decomposition temperature of the polymer, copolymer or terpolymer employed is increased to greater than 160° C. by employing pendant groups that form secondary carbonium ion intermediates with an available adjacent proton.

In other approaches to resist chemistries, a polymer (without radiation sensitive acid generator) is formulated to have a backbone and pendant group that together yield the desired properties. Such proposed material described in Japanese Kokai No. SH057 [1983] 118641 includes a methyl methacrylate backbone and alkoxyalkyl pendant groups.

SUMMARY OF THE INVENTION

The present invention involves the fabrication of devices utilizing resist formulations that afford sensitivities better than 30 mJ/cm$^2$ for optical radiation, 25 μC/cm$^2$ for electron radiation, and resolution better than 1.0 μm. The resists include acid generators and polymers that possess recurring acid labile groups including α-alkoxyalkyl carboxylic acid esters and/or α-alkoxyalkyl ether derivatives of hydroxyaryl or hydroxyaralkyl esters of carboxylic acids. These resists are sensitive not only to deep UV radiation but also to UV radiation, x-radiation, and particle beam radiation. The inventive resist materials include an acid generator and a resin generically described as having pendant functional groups attached directly or indirectly to a polymer backbone where the structure of the pendant group is represented by the formulae:

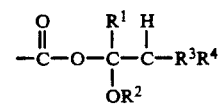

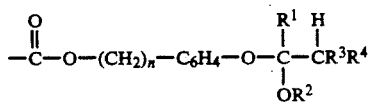

where:

n is 0–4;

R$^1$ is hydrogen, lower alkyl (e.g. alkyl having up to 6 carbon atoms);

R$^2$ is lower alkyl; and

R$^3$ and R$^4$ independently are hydrogen or lower alkyl where the definition of lower alkyl includes the joining of $R^1$ and $R^2$ or $R^1$ and either $R^3$ or $R^4$, or $R^2$ and either $R^3$ or $R^4$ to form a 5-, 6- or 7-membered ring.

Exemplary of resins utilized in these resist compositions are copolymers of benzyl methacrylate and tetrahydropyranyl methacrylate, and polymers of 4-tetrahydropyranyloxybenzyl methacrylate (or acrylate).

DETAILED DESCRIPTION OF THE INVENTION

Excellent resolution and sensitivity are obtained in device and mask fabrication by utilizing specific resins in conjunction with a radiolytic acid generator. Such resins involve a polymer backbone such as methacrylate, acrylate, or styrene backbone having pendant acid labile groups attached directly or indirectly to the polymer chain described as:

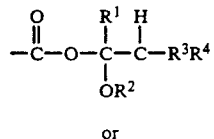

or

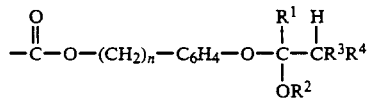

where:

n is 0–4;

$R^1$ is hydrogen or lower alkyl (alkyl having up to 6 carbon atoms);

$R^2$ is lower alkyl (having up to 6 carbon atoms) and $R^3$ and $R^4$ are independently hydrogen or lower alkyl and where the generic description includes compositions such that the structure is as defined above but where $R^1$ and $R^2$, or $R^1$ and either $R^3$ or $R^4$, or $R^2$ and either $R^3$ or $R^4$ are connected to form a 5, 6 or 7 membered ring.

Examples of resins utilized in these resist compositions are copolymers of benzyl methacrylate and tetrahydropyranyl methacrylate and benzyl mathacrylate and tetrahydropyranyloxybenzyl methacrylate, and polymers of 4-tetrahydropyranyloxybenzyl methacrylate (or acrylate). The structure of the phenylene group ($C_6H_4$) in the 4-tetrahydropyranyloxybenzyl methacrylate (or acrylate) may be ortho, meta or para.

If a copolymer is used, the ratio of acid labile groups to non-acid labile groups in the copolymer is dependent on the structure and acidity of the polymeric acid species formed upon irradiation. For methacrylic acid forming systems the ratio should be at least one acid labile moiety per twenty hydrophobic groups. Mole ratio required depends strongly on strength of acid, molecular size of acid-labile group, and hydroprobicity of non-acid forming group. A control sample is easily employed to determine suitable ratios for a desired group. Additionally, both the ratio of the acid labile pendant group to non-acid labile groups and the type of pendant groups employed should be chosen so that after exposure and optional post exposure bake, but before development, a volume loss of less than 25% is incurred in the exposed region. (Volume loss is measured by layer thickness changes.) For volume losses greater than 25%, image distortion is possible. Groups such as tertiarybutylcarbonyloxy afford volatile products which in turn produce relatively large volume changes upon exposure and subsequent optional thermal processing to complete the reaction. Groups such as tetrahydropyranyloxy attached to aromatic acrylic polymers and present in only one monomer of a copolymer or terpolymer afford volume changes less than 25% after exposure and further processing.

The molecular weight of the resin material should generally be in the range of 5,000 to 500,000 g/mole. Molecular weights less than 5,000 g/mole lead to poor film formation characteristics and too rapid dissolution of the base-soluble form, while molecular weights greater than 500,000 g/mole lead to solutions with too high viscosity and poor dissolution characteristics upon exposure and processing. The polydispersivity of the Polymer ($\overline{M}_w/\overline{M}_n$) should be less than 1.75. Polydispersivities greater than 1.75, although not precluded, generally lead to decreased lithographic reproducibility. If the resist is used during subsequent plasma processing, the monomers employed as well as the pendant group should also be chosen such that the glass transition, $T_g$, or the resulting resin is preferably higher than 60° C. and most preferably higher than 130° C. To obtain a desirable $T_g$, aromatic monomers such as styrene and benzyl methacrylate that are compatible with the desired lithographic characteristics are employed. Additionally, solutions of the material should be of suitable viscosity, generally in the range of 10 to 500 cp, to form an essentially pinhole-free, continuous coating on the substrate with thicknesses in the range of 0.5 to 2.0 $\mu$m. For example, in the case of a silicon-based substrate, the polymers forming resist layers thinner than 0.5 $\mu$m are difficult to maintain pinhole-free, while layers thicker than 2.0 $\mu$m are difficult to coat uniformly. These resists are sensitive not only to deep UV radiation but also to UV radiation, x-radiation, and particle beam radiation.

Pendant groups of the generic formulae above are attached to the polymer backbone or are directly or indirectly pendant from the polymer backbone. Examples of attachment points are 1) the carbon atom in the $\alpha$-position relative to the carboxylic acid group in acrylic or methacrylic polymers; and 2) the carbon atom in the benzene ring of polystyrene that is para- to the point of polymer backbone attachment.

Although the specific backbone employed in the resin is not critical, methacrylates, acrylates and styrenes are advantageously used since they generally yield materials with relatively low optical densities needed for high resolution in spectral regions suitable for exposure, e.g. 248 nm. Typically optical densities for the resins of greater than 0.30 per $\mu$m are undesirable. For suitable resolution, resist thicknesses in the range 0.8 to 1.2 $\mu$m are employed in device fabrication while thinner 0.2–0.5 $\mu$m films are adequate for mask fabrication. If the optical density of the resin is greater than 0.30 per $\mu$m, a uniform optical exposure through the thickness of such materials is not generally attained and resolution is degraded.

The specific pendant group within the generic class described also affects resist properties. For example, if the resist is to be employed as a mask in a plasma etching procedure it is desirable to include aromatic moieties such as phenyl groups which offer relatively high resistance to typical plasma etchants such as $Cl_2$ and $CHF_3$. Similarly, if adhesion is more desirable than etch resistance, another moiety also is employed.

It is also possible to modify resist properties by employing a backbone polymer that is a copolymer, terpolymer or block copolymer of various monomers At least one of the comonomers must contain a pendant acid labile group. For example, typically monomers such as methyl methacrylate, butyl methacrylate, benzyl methacrylate, benzyl acrylate and styrene as well as small amounts (typically less than 5 mole percent) of glycidyl methacrylate as an adhesion promoter are usefully employed However, monomers that are very easily hydrolyzed or thermally labile functional groups should be avoided because of thermal instability.

The acid-labile resins utilized in the invention are typically formed by polymerization of monomeric components that contain the acid-labile group such as a monomeric acid-labile carboxylic acid ester that has been formed by the reaction of a monomeric carboxylic acid with an alkyl vinyl ether such as ethyl vinyl ether or a cyclic vinyl ether such as dihydropyran or a monomeric acid-labile alkoxy aryl ester (or alkoxyaralkyl ester) of a carboxylic acid that has been formed by the reaction of a hydroxyl aryl ester (or hydroxyaralkyl ester) of a carboxylic acid with an alkyl vinyl ether such as ethyl vinyl ether or a cyclic vinyl ether such as dihydropyran. Alternatively, reaction of polymer bound carboxylic acids with vinyl ethers in the presence of an acid catalyst or the reaction of the hydroxyl groups of polymer bound hydroxy aryl esters (or hydroxyaralkyl esters) of carboxylic acids with vinyl ethers in the presence of an acid catalyst is employed.

It is possible to synthesize the polymers employed in the present invention from the above described monomers by group transfer polymerization or by a polymerization reaction such as free radical polymerization or other polymerization methods such as anionic polymerization. The molecular weight of the polymer is dependent on reaction parameters such as reagents, concentrations, temperature, time and catalysts. These parameters are interrelated and a control sample is utilized to determine the specific conditions necessary to yield a desired molecular weight. However, generally for molecular weights in the desired range and for typical copolymers such as those of benzyl methacrylate and tetrahydropyranyl methacrylate concentrations in the range of 0.3 to 0.7 moles/liter, temperatures of approximately 80° C., catalysts such as benzoyl peroxide (0.006 to 0.01 moles/liter) and reaction times in the range of 3 to 7 hours are employed. If a relatively low polydispersivity is desired, group transfer polymerization as described in U.S. Pat. No. 4,417,034 and in Dicker, et al., "Polymer Preprints", *American Chemical Society Division of Polymer Chemistry*, 28(1), 106 (1987) is employed.

The weight percentage of the radiolytic acid generator relative to the resin in the polymer should generally be as low as possible without unacceptably sacrificing sensitivity. Weight percentages less than 0.1 lead to insensitive compositions while weight percentages greater than 5.0 tend to yield compatibility and control problems. Further, it is possible to add other monomers or additives such as polyketals and acetals, plasticizers and/or crosslinkers into the resist composition to modify certain properties. Clearly it is contemplated that the acid generator undergo acid formation upon exposure to actinic radiation. The acid generator employed is chosen for the particular desired actinic radiation. For example, acid generators such as diphenyliodonium tosylate and triphenylsulfonium trifluoromethanesulfonate are suitable for deep ultraviolet, x-ray, electron beam or ion beam exposure.

The resist film is initially formed by a variety of techniques such as those described in *Semiconductor Lithography*, by W. M. Moreau, Plenum Press, New York, 1988. Typically, the resin and acid generator are dissolved in solvents such as cyclopentanone. Typical resin concentrations in the solvent of 10 to 20 wt % in the solvent are used to give approximately 1 μm thickness films. For methods such as spincoating the solution is generally placed on the wafer and the wafer is spun at a rate of 1000 to 6000 rpm.

After the resist is formed on the substrate, it is desirable although not essential to prebake the material. This prebake is conveniently performed in the temperature range 70° to 130° C. for periods in the range ½ to 30 min. The temperature and time period are adjusted to obtain enhanced sensitivity and resolution. It is also desirable, but not essential, to bake the exposed resist material after exposure but before development to augment the acid catalyzed removal of the protecting group. Typically temperatures in the range 70°-to 115° C. in conjunction with time periods in the range 0.5 to 5 min are employed. These parameter ranges are employed to yield complete conversion of the protecting group to the acidic compound. Particular time period and temperature ranges are affected by the resin composition and the nature of the protecting group.

After exposure and optional post-bake, the exposed portion has a different solubility from those portions that were not subjected to actinic radiation. Generally a solvent is employed to develop the exposed material that is preferentially dissolved and leaves the unexposed portion of the resist material essentially untouched. For resins forming acidic groups upon exposure, aqueous base developers are employed Aqueous-base solutions such as 0.25 wt % tetramethylammonium hydroxide in water are preferred since they avoid typical disposal problems associated with organic solvents and develop the patterns without appreciable swelling.

After the photosensitive region is developed the resulting pattern is useful as an etching mask or for other conventional processing steps utilizing a delineated resist pattern such as ion implanation. After use, the resist material is typically removed with a suitable solvent stripper such as methyl ethyl ketone.

The following examples are illustrative of the invention.

EXAMPLE 1

Preparation of 1:1 Random Copolymer of Tetrahydropyranyl Methacrylate and Benzyl Methacrylate by Group Transfer Polymerization To a solution of 0.74 mL (2.5 mmol) of 1-(2-trimethylsiloxyethoxy)-1-trimethylsiloxy-2-methyl-1-propene (TTEB) and 50 μL of tetrabutylammonium biacetate hexahydrate (0.04M in tetrahydrofuran) in 75 mL of tetrahydrofuran (THF) under argon was added a mixture of 25 mL (25.43 g, 0.1445 mol) of benzyl methacrylate and 24 mL (24.57 g, 0.1445 mol) of tetrahydropyranyl methacrylate (THPMA) at a rate such that the temperature did not exceed 38.2° C. Both monomers had been individually passed over columns of basic alumina under an argon atmosphere just prior to use. NMR analysis of an aliquot of the reaction mixture showed no residual monomer. The product was precipitated in methanol and dried at room temperature to give 47.6 g of poly(benzyl methacrylate-co-tetrahydropyranyl methacrylate). GPC: $\overline{M}_n = 19,500$, $\overline{M}_w = 22,000$, $\overline{M}_w/\overline{M}_n = 1.13$ (polystyrene standard). NMR analysis of the copolymer shows the composition to be 1:1 on a molar basis. In a similar experiment in which the quantity of monomers, initiator and catalyst were decreased to 60% of the above amounts, 1:1 copolymer was obtained with $\overline{M}_n = 19,200$, $\overline{M}_w = 21,000$, $\overline{M}_w/\overline{M}_n = 1.096$.

EXAMPLE 2

Preparation of Homopolymer of Tetrahydropyranyl Methacrylate

To a solution of 0.30 mL (1 mmol) of TTEB and 25 µL of tetrabutylammonium biacetate hexahydrate (0.04M in THF) under argon in 75 mL of THF was added 20 g (19.6 mL, 0.1175 mol) of THPMA, that had been purified over a column of basic alumina just prior to use, at a rate such that the temperature did not exceed 40° C. NMR analysis of an aliquot of the solution showed that there was no residual monomer. Precipitation in methanol followed by drying in a vacuum oven at room temperature gave 19.9 g of Poly(tetrahydropyranyl methacrylate). GPC: $\overline{M}_n = 19,300$, $\overline{M}_n = 21,100$, $\overline{M}_w/\overline{M}_n = 1.093$. Differential scanning calorimetry showed a $T_g$ at 91° C.

EXAMPLE 3

Preparation of 1:1 Random Copolymer of Tetrahydropyranyl Methacrylate and Benzyl Methacrylate To a solution of 12 mL of THPMA and 12.5 mL of benzyl methacrylate (both monomers purified separately over basic alumina) in methyl ethyl ketone (degassed with nitrogen) under argon at 75° C. was added 0.15 g of azo-bis-isbutyronitrile ("VAZO 64"). After a total reaction time of 11.5 hr and a total VAZO 64 catalyst addition of 0.3 g, precipitation in hexane gave 22.2 g of poly(benzyl methacrylate-cotetrahydropyranyl methacrylate). NMR analysis of an aliquot of the reaction mixture showed 92% conversion. GPC: $\overline{M}_n = 20,000$, $\overline{M}_w = 48,700$, $\overline{M}_w/\overline{M}_n = 2.433$.

EXAMPLE 4

Preparation of Poly(4-tetrahydropyranyloxybenzyl methacrylate)

A. Preparation of Methyl 4-Tetrahydropyranyloxybensoate

To a stirred mixture of 157 mL (1.72 mol) of 3,4-dihydro-4H-pyran, 300 mL of methylene chloride and 131 g (0.86 mol) of methyl 4-hydroxybenzoate was added 5 drops of 20% sulfuric acid. Addition of the acid caused the ester to dissolve and the temperature to rise 6° C. After stirring for 20 hr, the solution was evaporated, and the residue was dissolved in ether and passed through a short column of basic alumina. The effluent was evaporated to small volume, and 144.7 g of methyl 4-tetrahydropyranyloxy benzoate crystallized as an off-white solid, m.p. 70° C.

$^1$H NMR (360 MHz, CDCl$_3$, d ppm, J in Hz): 1.5-2.1 (m's, 6H, CH$_3$), 3.87 (s, 3H, OMe), 5.49 (t, J=3.6, 1H, OCHO), 7.06 (d, J=9, 2H, ArH), 7.97 (d, J=9, 2H, ArH).

IR (CCl$_4$) 1722 cm$^{-1}$ (ester C=O)

B. Preparation of Tetrahydropyranyloxybenzyl Alcohol

To a mechanically stirred slurry of 10 g of lithium aluminum hydride and 100 mL of tetrahydrofuran was added dropwise with cooling in an ice bath a solution of 32.9 g (0.139 mol) of methyl 4-tetrahydropyranyloxy benzoate at a rate such that the temperature did not exceed 30° C. After stirring 18 hr at room temperature, the solution was treated cautiously with 100 mL of water. The mixture was filtered, and the filtrate was stirred with 200 mL of aqueous sodium hydroxide for 2 hr. The organic layer was separated and evaporated with a rotary evaporator. The residue was dissolved in 200 mL of ether and washed three times with 5% aqueous sodium bicarbonate and dried over sodium sulfate. Evaporation gave 20.58 g of 4-tetrahydropyranyloxy benzyl alcohol as a liquid.

$^1$H NMR (360 MHz, THF—d$_8$): 1.45-2.0 (m's, 6H, CH$_2$), 3.5 (m, 1H, OCH$_2$), 3.8 (m, 1H, OCH$_2$), 4.25 (t, J=6, 1H, OH), 4.45 (d, J=6, 2H, ArCH$_2$OH), 5.35 (t, J=3, 1H, OCHO), 6.95 (d, J=8, 2H, ArH), 7.19 (d, J=8, 2H, ArH).

IR shows no ester C=O absorption.

C. Preparation of 4-Tetrahydropyranyloxybenzyl Methacrylate

To a stirred solution of 62.4 9 (0.3 mol) of 4-tetrahydropyranyloxy benzyl alcohol and 58.5 mL of triethylamine in 225 mL of methylene chloride and 225 mL of diethyl ether cooled in an ice bath was added dropwise 31.9 mL (0.33 mol) of methacrylyl chloride at a rate such that the temperature did not exceed 30° C. After 3.5 hr, the mixture was filtered, and the fitrate was evaporated. The residual oil was treated with ether and triethylamine and washed with water. The organic layer was dried (sodium sulfate) and evaporated to a yellow oil, which, on standing, gradually crystallized. The crystals were rinsed with a small amount of methanol to give 7.3 g of colorless crystals, m.p. 36°-36.7° C. The product can be recrystallized from hexane at low temperature. $^1$H NMR (360 MHz, THF—d$_8$): 1.5-1.82 (m's, 6H, CH$_2$), 1.90 (m, 3H, CH$_3$C=), 3.5 (m, 1h, OCH$_2$), 3.8 (m, 1H, OCH$_2$), 5.07 (s, 2H, ArCH$_2$OOC), 5.40 (t, J=3, 1H, OCHO), 5.52 (m, 1H, =CH), 6.05 (m, 1H, =CH), 7.0 (m, 2H, ArH), 7.27 (m, 2H, ArH).

IR (CCl$_4$): 1720 cm$^{-1}$ (conj. ester C=O ), 1640 cm$^{-1}$ (C=C).

D. Preparation of Poly(4-tetrahydropyranyloxybenzyl methacrylate)

After purification by passage of a solution in hexane over a short column of basic alumina, 14.45 g (52.3 mmol) 4-tetrahydropyranyloxybenzyl methacrylate, was dissolved in 45 mL of THF, and then treated 0.4 mL (2.42 mmol) of bis(dimethylaminomethylsilane (scavenger). After stirring for 30 min, 0.101 mL (0.503 mmol) of 1-methoxy-1-trimethylsiloxy-2-methyl-1-propene and 20 µL of tetrabutylammonium m-chlorobenzoate (0.3M in THF) were added. Since no exothermic polymerization was observed, an additional 40 µL of tetrabutylammonium m-chlorobenzoate (0.3M in THF) was added. A temperature rise of 6° C. occcurred during 25 min. When the temperature had returned to room temperature, the reaction was quenched with 1 mL of methanol. Addition of the reaction mixture to 500 mL of methanol caused precipitation of 12.64 g of poly(4-tetrahydropyranyloxybenzyl methacrylate) as a colorless solid. GPC (polystyrene standard): $\overline{M}_n = 23,300$, $\overline{M}_w = 28,900$, $\overline{M}_w/\overline{M}_n = 1.24$.

$^1$H NMR (360 MHz, THF—d$_8$: 0.75m 0.95, 1.15 (br s, 3H, CH$_3$) 1.45-2.05 (br m's, 8H, CH$_2$), 3.51 (m, 1H, OCH$_2$), 3.80 (m, 1H, OCH$_2$), 4.84 (br s, 2H, ArCH$_2$O), 5.40 (m, 1H, OCHO), 7.01 (m, 2H, ArH), 7.23 (m, 2H, ArH).

The tactic composition estimated from the $^1$H methyl resonance intensities is 54% rr, 43% rm, and 3% rr.

IR (nujol): 1730 cm$^{-1}$ (unconjugated ester C=O).

UV (glyme): 225 nm ($\epsilon$11,466), 272 nm $\epsilon$1053), 278 nm ($\epsilon$903).

DSC: $T_g$=79.8° C.

EXAMPLE 5

To a 20 wt % solution in 2-methoxyethyl ether of a methacrylate copolymer containing 55 mole % benzyl methacrylate and 45 mole % tetrahydropyranyl methacrylate [P(BMA-co-TMA)] having a molecular weight of 18,000 g/mole was added 0.4 wt % of triphenylsulfonium trifluoromethanesulfonate. The resulting solution was used to spin coat a silicon wafer at 1000 rpm. The coated wafer was heated at 105° C. for 15 min to give a 0.8 μm thick film and then was exposed to 248.4 nm light using a 0.38 NA, 5X demagnification step-and-repeat exposure apparatus. After curing for 2.0 h at 25° C. the exposed regions were removed by immersion development in 0.63 wt % aqueous tetramethylammonium hydroxide (TMAH) at 25° C. for 1.0 min. At a dose of 44 mJ/cm$^2$, 0.6 μm line and space patterns were obtained.

EXAMPLE 6

To a 20 wt % solution of 1:1 P(BMA-co-TMA) in cyclopentanone was added 0.1 wt % of diphenyliodonium p-toluenesulfonate. A silicon wafer was spin coated with the resulting solution at 1800 rpm and heated at 115° C. for 5 min on a hot plate to give a 1 μm thick film. The wafer was exposed as in Example 1 and heated at 115° C. for 1 min. Immersion development in 2.5 wt % morpholine in water at 25° C. for 8 min afforded 0.8 μm line and space patterns at a dose of 24 mJ/cm$^2$.

EXAMPLE 7

To a 10 wt % solution of 1:1 P(BMA-co-TMA) in cyolopentanone was added 0.2 wt % of diphenyliodonium p-toluenesulfonate. A silicon wafer was spin coated with the resulting solution at 2250 rpm and heated at 115° C. for 5 min on a hot plate to give a 0.42 μm thick film. The coated wafer was exposed to 20 keV electron-beam irradiation from a Cambridge electron-beam exposure system. The exposed film was heated at 115° C. for 15 sec. Immersion development in 2.5 wt % morpholine in water at 25.0° C. for 5 min afforded 0.75 μm line and space patterns at 22 μC/cm$^2$.

As many differing embodiments of this invention may be made without departing from the spirit and scope thereof, it is to be understood that this invention is not limited to the specific embodiments exemplified except as defined by the appended claims.

What is claimed is:

1. A material comprising 1) a polymer chosen from the group consisting of compositions having a polymer backbone and pendant groups bound directly or indirectly to said backbone, said pendant groups represented by the formulae:

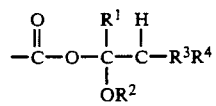

or

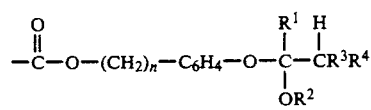

where
n is 0–4;
R$^1$ is hydrogen or lower alkyl;
R$^2$ is lower alkyl; and
R$^3$ and R$^4$ independently are hydrogen or lower alkyl where the definition of lower alkyl includes the joining of R$^1$ and R$^2$ or R$^1$ and either R$^3$ or R$^4$, or R$^2$ and either R$^3$ or R$^4$ to form a 5-, 6- or 7-membered ring; and (2) a material that forms an acid upon irradiation.

2. The material of claim 1 wherein said polymer comprises a copolymer, terpolymer or block polymer.

3. The material of claim 2 wherein said material comprises a copolymer of benzyl methacrylate and tetrahydropyranyl methacrylate.

4. The material of claim 2 wherein a monomer used to form said copolymer, terpolymer or block polymer comprises 4-tetrahydropyranyloxybenzyl methacrylate.

5. The material of claim 1 wherein said polymer comprises a homopolymer of 4-tetrahydropyranyloxybenzyl methacrylate.

6. The material of claim 1 wherein said polymer is selected from the group consisting of polymethacrylates, polyacrylates and polystyrenes.

7. The material of claim 2 wherein the polymer contains comonomers having no pendant acid labile groups.

8. The material of claim 7 wherein the comonomer having no pendant acid labile groups is selected from methyl methacrylate, butyl methacrylate, benzyl methacrylate, benzyl acrylate and styrene.

9. The material of claim 8 wherein glycidyl methacrylate is added in a quantity suitable for adhesion promotion.

10. The material of claim 9 wherein the quantity of glycidyl methacrylate added is about 5 mole % or less.

11. The material of claim 8 wherein one of the monomers is benzyl methacrylate.

12. The material of claim 6 wherein said polymer comprises an acrylic or methacrylic polymer.

13. The material of claim 1 wherein said polymer is prepared by group transfer polymerization.

14. The material of claim 1 wherein said polymer is prepared by free radical polymerization.

15. The material of claim 1 wherein said polymer has a polydispersity less than 1.75.

16. The material of claim 1 wherein said acid generator comprises diphenyliodonium tosylate.

17. The material of claim 1 wherein said acid generator comprises triphenylsulfonium trifluoromethanesulfonate.

18. The material of claim 1 further including a solvent.

19. The material of claim 18 wherein said solvent is cyclopentanone.

20. A homopolymer of 4-tetrahydropyranyloxbenzyl methacrylate.

21. A copolymer containing 4-tetrahydropyranyloxybenzyle methacrylate.

22. The material of claim 1 wherein a crosslinker is added.

* * * * *

UNITED STATES PATENT AND TRADEMARK OFFICE
CERTIFICATE OF CORRECTION

PATENT NO. : 5,206,317
DATED : APRIL 27, 1993
INVENTOR(S) : HERTLER ET AL.

It is certified that error appears in the above-identified patent and that said Letters Patent is hereby corrected as shown below:

Column 7, Line 45, delete "Tetrahydropryanyloxybensoate" and insert in its place - - Tetrahydropyranyloxybenzoate - - .

Column 8, Line 54, delete "Chlorabenzoate" and insert in its place - - Chlorobenzoate - - .

Column 10, line 65, delete "ybenzyle methacrylate" and insert in its place - - ybenzyl methacrylate - - .

Signed and Sealed this

Twenty-first Day of June, 1994

Attest:

BRUCE LEHMAN

Attesting Officer

Commissioner of Patents and Trademarks